(12) United States Patent
Yang et al.

(10) Patent No.: US 8,928,380 B2
(45) Date of Patent: Jan. 6, 2015

(54) CURRENT-MODE D LATCH WITH RESET FUNCTION AND ASSOCIATED CIRCUIT

(71) Applicants: Global Unichip Corporation, Hsinchu (TW); Taiwan Semiconductor Manufacturing Co., Ltd., Hsin-Chu (TW)

(72) Inventors: Tsai-Ming Yang, Tainan (TW); Yen-Chung Chen, Sunnyvale, CA (US); Yi-Lin Lee, Tainan (TW); Jen-Tai Hsu, Miaoli County (TW)

(73) Assignees: Global Unichip Corporation, Hsinchu (TW); Taiwan Semiconductor Manufacturing Co., Ltd, Hsin-Chu (TW)

( * ) Notice: Subject to any disclaimer, the term of this patent is extended or adjusted under 35 U.S.C. 154(b) by 0 days.

(21) Appl. No.: 14/219,492

(22) Filed: Mar. 19, 2014

(65) Prior Publication Data

US 2014/0285248 A1 Sep. 25, 2014

(30) Foreign Application Priority Data

Mar. 22, 2013 (TW) .............................. 102110257 A

(51) Int. Cl.
*H03K 3/00* (2006.01)
*H03K 3/037* (2006.01)

(52) U.S. Cl.
CPC ...................................... *H03K 3/037* (2013.01)
USPC ............ 327/218; 327/203; 327/208; 327/217

(58) Field of Classification Search
USPC ............. 327/55, 57, 202, 203, 208, 210, 211, 327/215, 217, 218; 326/115, 127
See application file for complete search history.

(56) References Cited

U.S. PATENT DOCUMENTS

| 6,573,775 | B2 | 6/2003 | Pilling et al. | |
|---|---|---|---|---|
| 6,686,787 | B2* | 2/2004 | Ling | 327/203 |
| 6,762,637 | B2 | 7/2004 | Raychaudhuri et al. | |
| 7,034,594 | B2* | 4/2006 | Meltzer et al. | 327/218 |
| 7,131,092 | B2 | 10/2006 | Ham et al. | |
| 7,915,940 | B2* | 3/2011 | Hayashi | 327/218 |
| 2005/0242842 | A1 | 11/2005 | Meltzer et al. | |

FOREIGN PATENT DOCUMENTS

TW I275248 B 3/2007

* cited by examiner

*Primary Examiner* — Long Nguyen
(74) *Attorney, Agent, or Firm* — WPAT, PC; Justin King

(57) ABSTRACT

A current-mode D latch includes a first load element, a second load element, a first bias current source, a first switch transistor, a second switch transistor, a first stage circuit and a second stage circuit. The first switch transistor is controlled by an inverted reset signal. The second switch transistor is controlled by a reset signal. When an inverted clock signal is in a first level state and the reset signal is inactive, the first input signal is converted into the first output signal and the first inverted input signal is converted into the first inverted output signal by the first stage circuit. When a clock signal is in the first level state and the reset signal is inactive, the first output signal and the first inverted output signal are maintained by the second stage circuit.

11 Claims, 6 Drawing Sheets

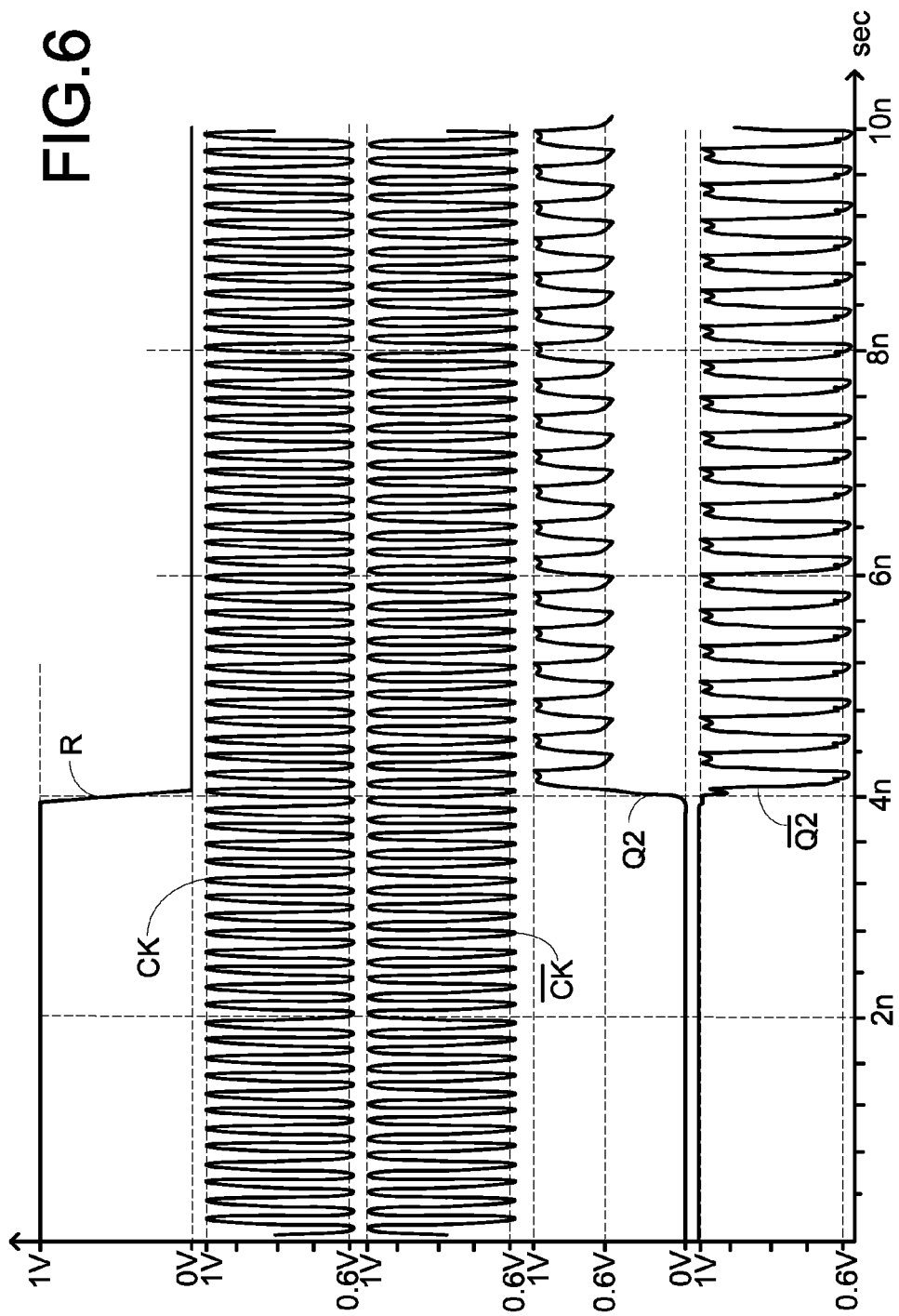

CURRENT-MODE D LATCH WITH RESET FUNCTION AND ASSOCIATED CIRCUIT

This application claims the benefit of Taiwan Patent Application No. 102110257, filed Mar. 22, 2013, the subject matter of which is incorporated herein by reference.

FIELD OF THE INVENTION

The present invention relates to a D latch, and more particularly to a current-mode D latch with a reset function.

BACKGROUND OF THE INVENTION

FIG. 1 is a schematic circuit block diagram illustrating a conventional digital D latch. As shown in FIG. 1, the conventional digital D latch 100 comprises a first stage circuit 102, a second stage circuit 104, and an inverter 106. A clock signal CK is inputted into a clock input terminal ck2 of the second stage circuit 104. Moreover, the clock signal CK is also inputted into the inverter 106, so that an inverted clock signal $\overline{CK}$ is outputted from the inverter 106. The inverted clock signal $\overline{CK}$ is inputted into a clock input terminal ck1 of the first stage circuit 102. The first stage circuit 102 may be considered as a master latching circuit, and the second stage circuit 104 may be considered as a slave latching circuit.

In response to a first voltage level (e.g. a low voltage level) of the clock signal CK and a second voltage level (e.g. a high voltage level), the first stage circuit 102 is enabled, but the second stage circuit 104 is disabled. Meanwhile, a logic level of an input signal D is transmitted from an input terminal d1 of the first stage circuit 102 to an output terminal q1 of the first stage circuit 102. Consequently, in response to the first voltage level of the clock signal CK, the input signal D and an output signal O1 of the first stage circuit 102 have the same logic level.

In response to the second voltage level (e.g. the high voltage level) of the clock signal CK and the first voltage level (e.g. the low voltage level), the first stage circuit 102 is disabled, but the second stage circuit 104 is enabled. Meanwhile, regardless of whether the input signal D is changed or not, the output signal O1 of the first stage circuit 102 is maintained at the original logic level. In addition, after the output signal O1 of the first stage circuit 102 is inputted into an input terminal d2 of the second stage circuit 104, an output signal O2 is outputted from an output terminal q2 of the second stage circuit 104. The output signal O2 of the second stage circuit 104 is an output signal Q of the digital D latch 100.

From the above discussions, the clock signal CK and the input signal D of the conventional digital D latch 100 are standard logic levels. In case that the frequency of the clock signal CK is not very high, the conventional digital D latch 100 can be normally operated. However, when the frequency of the clock signal CK is up to the GHz level, the conventional digital D latch 100 is usually abnormal.

Therefore, there is a need of providing a current-mode D latch that is operable at a high frequency and has a reset function.

SUMMARY OF THE INVENTION

An embodiment of the present invention provides a current-mode D latch. The current-mode D latch includes a first load element, a second load element, a first stage circuit, a second stage circuit, a bias current source, a first switch transistor, and a second switch transistor. The first load element is connected between a power supply voltage and a node x, wherein the node x generates an output signal. The second load element is connected between the power supply voltage and a node y, wherein the node y generates an inverted output signal. The first stage circuit includes a first transistor, a second transistor and a third transistor. The first transistor has a drain terminal connected with the node x, a gate terminal receiving an inverted input signal and a source terminal connected with a node a. The second transistor has a drain terminal connected with the node y, a gate terminal receiving an input signal and a source terminal connected with the node a. The third transistor has a drain terminal connected with the node a, a gate terminal receiving an inverted clock signal and a source terminal connected with a node c. The second stage circuit includes a fourth transistor, a fifth transistor and a sixth transistor. The fourth transistor has a drain terminal connected with the node x, a gate terminal connected with the node y and a source terminal connected with a node b. The fifth transistor has a drain terminal connected with the node y, a gate terminal connected with the node x and a source terminal connected with the node b. The sixth transistor has a drain terminal connected with the node b, a gate terminal receiving a clock signal and a source terminal connected with the node c. The bias current source is connected between the node c and a ground voltage. The first switch transistor is connected between the power supply voltage and the node c, and controlled by an inverted reset signal. The second switch transistor is connected between the node x and the ground voltage, and controlled by a reset signal.

Another embodiment of the present invention provides a current-mode D latch. The current-mode D latch includes a first load element, a second load element, a bias current source, a first switch transistor, a second switch transistor, a first stage circuit, and a second stage circuit. The first load element is connected between a power supply voltage and a node x, wherein the node x generates an output signal. The second load element is connected between the power supply voltage and a node y, wherein the node y generates an inverted output signal. The bias current source is connected between a node c and a ground voltage. The first switch transistor is connected between the power supply voltage and the node c, and controlled by an inverted reset signal. The second switch transistor is connected between the node x and the ground voltage, and controlled by a reset signal. The first stage circuit is connected between the node x, the node y and the node c for receiving an input signal and an inverted input signal. When an inverted clock signal is in a first level state and the reset signal is inactive, the input signal is converted into the output signal and the inverted input signal is converted into the inverted output signal by the first stage circuit. The second stage circuit is connected between the node x, the node y and the node c for receiving the output signal and the inverted output signal. When a clock signal is in the first level state and the reset signal is inactive, the output signal and the inverted output signal are maintained by the second stage circuit.

A further embodiment of the present invention provides a current-mode D latching circuit. The current-mode D latching circuit includes a first current-mode D latch and a second current-mode D latch. The first current-mode D latch includes a first load element, a second load element, a first bias current source, a first switch transistor, a second switch transistor, a first stage circuit and a second stage circuit. The first load element is connected between a power supply voltage and a node x1, and the node x1 generates a first output signal. The second load element is connected between the power supply voltage and a node y1, and the node y1 generates a first inverted output signal. The first bias current source is connected between a node c1 and a ground voltage. The first switch transistor is connected between the power supply voltage and the node c1 and controlled by an inverted reset signal. The second switch transistor is connected between the node x1 and the ground voltage and controlled by a reset signal. The first stage circuit is connected between the node x1, the node y1 and the node c1 for receiving a first input signal and a first inverted input signal. When an inverted clock signal is in a first level state and the reset signal is inactive, the first input signal is converted into the first output signal and the first inverted input signal is converted into the first inverted output signal by the first stage circuit. The second stage circuit is connected between the node x1, the node y1 and the node c1 for receiving the first output signal and the first inverted output signal. When a clock signal is in the first level state and the reset signal is inactive, the first output signal and the first inverted output signal are maintained by the second stage circuit. The second current-mode D latch includes third load element, a fourth load element, a second bias current source, a third switch transistor, a fourth switch transistor, a third stage circuit and a fourth stage circuit. The third load element is connected between the power supply voltage and a node x2, and the node x2 generates a second output signal. The fourth load element is connected between the power supply voltage and a node y2, and the node y2 generates a second inverted output signal. The second bias current source is connected between a node c2 and the ground voltage. The third switch transistor is connected between the power supply voltage and the node y2 and controlled by the inverted reset signal. The fourth switch transistor is connected between the node x2 and the ground voltage and controlled by a reset signal. The third stage circuit is connected between the node x2, the node y2 and the node c2 for receiving a second input signal and a second inverted input signal. When the clock signal is in the first level state and the reset signal is inactive, the second input signal is converted into the second output signal and the second inverted input signal is converted into the second inverted output signal by the third stage circuit. The fourth stage circuit is connected between the node x2, the node y2 and the node c2 for receiving the second output signal and the second inverted output signal. When the inverted clock signal is in the first level state and the reset signal is inactive, the second output signal and the second inverted output signal are maintained by the fourth stage circuit. The first output signal is used as the second input signal, the first inverted output signal is used as the second inverted input signal, the second output signal is used as the first inverted input signal, and the second inverted output signal is used as the first input signal.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which:

FIG. 6 is a schematic timing waveform diagram illustrating associated signals processed by a current-mode D latching circuit with a reset function according to an embodiment of the present invention.

DETAILED DESCRIPTION OF PREFERRED EMBODIMENTS

Figure 1:
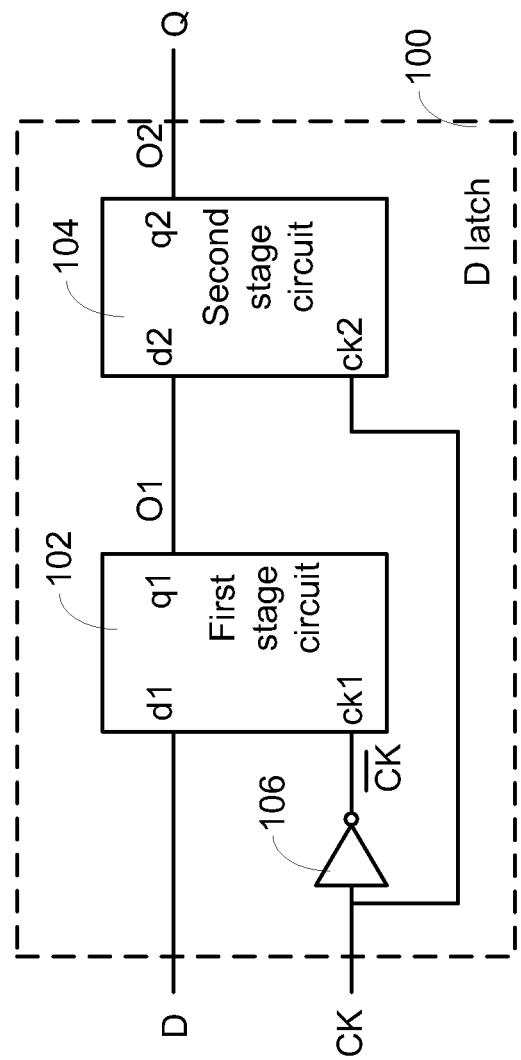
FIG. 1 (prior art) is a schematic circuit block diagram illustrating a conventional digital D latch.
Figure 2:
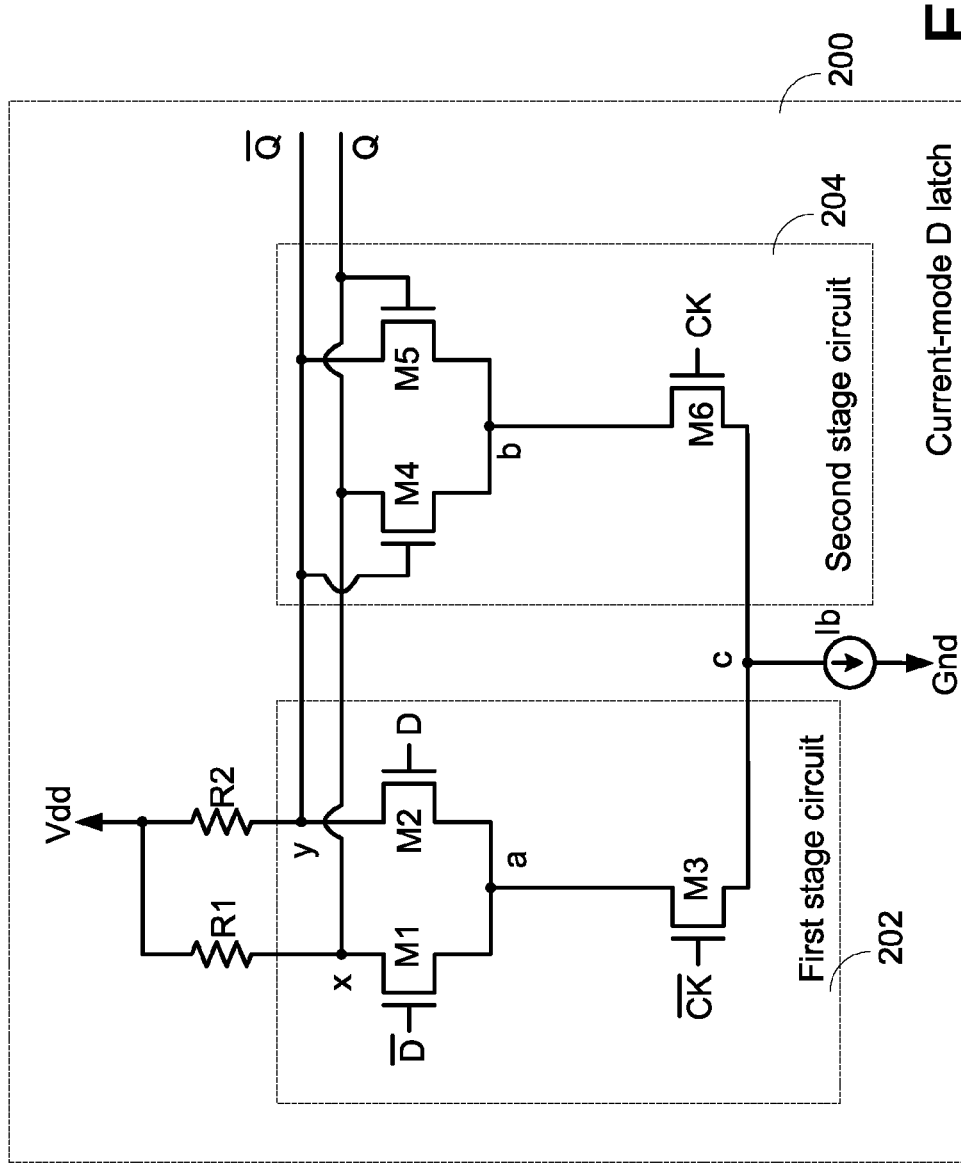
FIG. 2 is a schematic circuit block diagram illustrating a current-mode D latch according to an embodiment of the present invention.

FIG. 2 is a schematic circuit block diagram illustrating a current-mode D latch according to an embodiment of the present invention. As shown in FIG. 2, the current-mode D latch 200 comprises a first stage circuit 202, a second stage circuit 204, a first load element R1, a second load element R2, and a bias current source Ib. The first stage circuit 202 may be considered as a buffering circuit, and the second stage circuit 204 may be considered as a latching circuit.

The first load element R1 is connected between a power supply voltage Vdd and a node x. The second load element R2 is connected between the power supply voltage Vdd and a node y.

The first stage circuit 202 comprises a first transistor M1, a second transistor M2, and a third transistor M3. The first transistor M1 and the second transistor M2 are collaboratively defined as a first differential transistor pair. The drain terminal of the first transistor M1 is connected with the node x. The gate terminal of the first transistor M1 receives an inverted input signal $\overline{D}$. The source terminal of the first transistor M1 is connected with a node a. The drain terminal of the second transistor M2 is connected with the node y. The gate terminal of the second transistor M2 receives an input signal D. The source terminal of the second transistor M2 is connected with the node a. The drain terminal of the third transistor M3 is connected with the node a. The gate terminal of the third transistor M3 receives an inverted clock signal $\overline{CK}$. The source terminal of the third transistor M3 is connected with a node c. The signal at the node y is an inverted output signal $\overline{Q}$ of the current-mode D latch 200. Moreover, the signal at the node x is an output signal Q of the current-mode D latch 200.

The second stage circuit 204 comprises a fourth transistor M4, a fifth transistor M5, and a sixth transistor M6. The fourth transistor M4 and the fifth transistor M5 are collaboratively defined as a second differential transistor pair. The third transistor M3 and the sixth transistor M6 are collaboratively defined as a third differential transistor pair. The drain terminal of the fourth transistor M4 is connected with the node x. The gate terminal of the fourth transistor M4 is connected with the node y. The source terminal of the fourth transistor M4 is connected with a node b. The drain terminal of the fifth transistor M5 is connected with the node y. The gate terminal of the fifth transistor M5 is connected with the node x. The source terminal of the fifth transistor M5 is connected with the node b. The drain terminal of the sixth transistor M6 is connected with the node b. The gate terminal of the sixth transistor M6 receives a clock signal CK. The source terminal of the sixth transistor M6 is connected with the node c.

Moreover, the bias current source Ib is connected between a ground voltage Gnd and the node c. The bias current source Ib may provide a bias current to the first differential transistor pair, the second differential transistor pair and the third differential transistor pair.

From the above discussions, the input signal D and the inverted input signal $\overline{D}$ are current-mode logical signals (also referred as CML signals); the clock signal CK and the inverted clock signal $\overline{CK}$ are CML signals; and the output signal Q and the inverted output signal $\overline{Q}$ are also CML signals. For example, in these CML signals, the high voltage level is the power supply voltage Vdd, and the low voltage level is (Vdd-Vdrop). For example, if the power supply voltage Vdd is 1V and Vdrop is 0.5V, the high voltage level and the low voltage level of the CML signal is 1V and 0.5V, respectively.

Since the current-mode D latch 200 are operated according to the CML signals, when the frequency of the clock signal CK is up to the GHz level, the current-mode D latch 200 is still in a normal state. The principles of the current-mode D latch 200 in the normal state will be illustrated in more details as follows.

When the clock signal CK is in the low-level state and the inverted clock signal $\overline{CK}$ is in the high-level state, the third transistor M3 is turned on but the sixth transistor M6 is turned off. Consequently, the first stage circuit 202 is enabled, but the second stage circuit 204 is disabled. If the input signal D is in the low-level state and the inverted input signal $\overline{D}$ is in the high-level state, the first transistor M1 is turned on but the second transistor M2 is turned off. Consequently, the output signal Q is in the low-level state and the inverted output signal $\overline{Q}$ is in the high-level state. That is, in response to the low-level state of the clock signal CK, the first stage circuit 202 is enabled to pass the input signal D in the low-level state, and thus the first stage circuit 202 generates the output signal Q in the low-level state.

When the clock signal CK is in the high-level state and the inverted clock signal $\overline{CK}$ is in the low-level state, the third transistor M3 is turned off but the sixth transistor M6 is turned on. Consequently, the first stage circuit 202 is disabled, but the second stage circuit 204 is enabled. Since the output signal Q is in the low-level state and the inverted output signal $\overline{Q}$ is in the high-level state, the output signal Q is maintained in the low-level state and the inverted output signal $\overline{Q}$ is maintained in the high-level state by the latching actions of the fourth transistor M4 and the fifth transistor M5. That is, in response to the high-level state of the clock signal CK, the second stage circuit 204 is enabled to generate the output signal Q in the low-level state.

However, when the current-mode D latch is operated at a high speed, especially in the parallel data bus transmission, a signal skew problem may occur. Therefore, the current-mode D latch should have a reset function for synchronizing all circuits.

Figure 3:
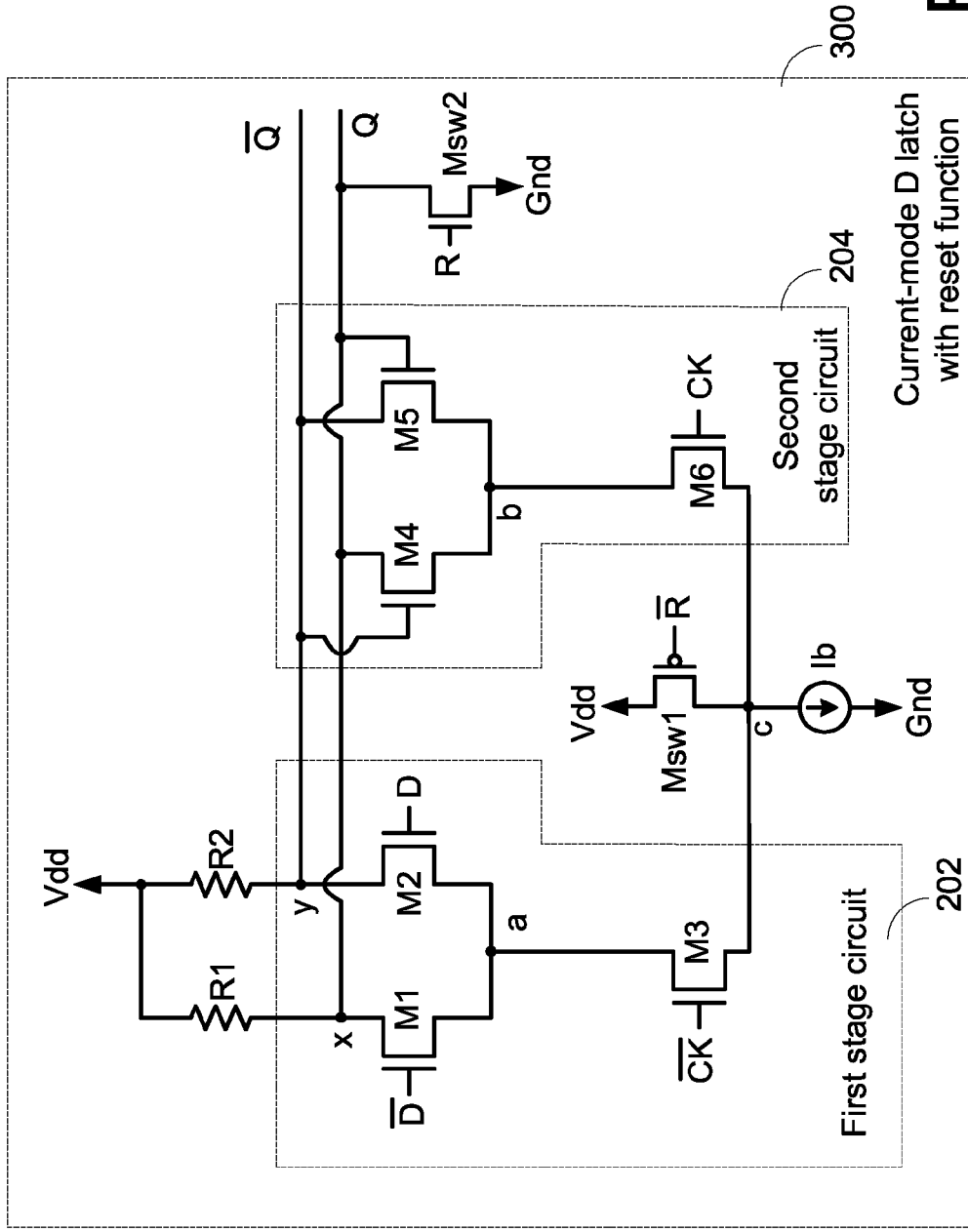
FIG. 3 is a schematic circuit block diagram illustrating a current-mode D latch with a reset function according to an embodiment of the present invention.

FIG. 3 is a schematic circuit block diagram illustrating a current-mode D latch with a reset function according to an embodiment of the present invention. As shown in FIG. 3, the current-mode D latch 300 with the reset function comprises a first stage circuit 202, a second stage circuit 204, a first load element R1, a second load element R2, a bias current source Ib, a first switch transistor Msw1, and a second switch transistor Msw2. The relationships between the first stage circuit 202, the second stage circuit 204, the first load element R1, the second load element R2 and the bias current source Ib are identical to those of FIG. 2, and are not redundantly described herein.

In comparison with the current-mode D latch of FIG. 2, the current-mode D latch 300 further comprises the first switch transistor Msw1 and the second switch transistor Msw2. The source terminal of the first switch transistor Msw1 is connected with the power supply voltage Vdd. The drain terminal of the first switch transistor Msw1 is connected with the node c. The gate terminal of the first switch transistor Msw1 receives an inverted reset signal $\overline{R}$. The source terminal of the second switch transistor Msw2 is connected with the ground voltage Gnd. The drain terminal of the second switch transistor Msw2 is connected with the node x. The gate terminal of the second switch transistor Msw2 receives a reset signal R. The voltages of the reset signal R and the inverted reset signal $\overline{R}$ are in the range between the power supply voltage Vdd and the ground voltage Gnd. In this embodiment, the first switch transistor Msw1 is a P-type transistor, and the second switch transistor Msw2 is an N-type transistor.

In the normal operation state, the reset signal R is in the low-level state and the inverted reset signal $\overline{R}$ is in the high-level state. In a reset state, the reset signal R is in the high-level state and the inverted reset signal $\overline{R}$ is in the low-level state.

Moreover, in the normal operation state, the reset signal R is inactive. That is, the reset signal R is in the low-level state and the inverted reset signal $\overline{R}$ is in the high-level state. Meanwhile, both of the first switch transistor Msw1 and the second switch transistor Msw2 are turned off. Under this circumstance, the operations of the current-mode D latch 300 are completely identical to those of the current-mode D latch 200 of FIG. 2, and are not redundantly described herein.

In the reset state, the reset signal R is active. That is, the reset signal R is in the high-level state and the inverted reset signal $\overline{R}$ is in the low-level state. Meanwhile, both of the first switch transistor Msw1 and the second switch transistor Msw2 are turned on.

Since the first switch transistor Msw1 is turned on, the voltage at the node c is pulled up to the power supply voltage Vdd. Under this circumstance, the third transistor M3 and the sixth transistor M6 are turned off. Meanwhile, both of the first stage circuit 202 and the second stage circuit 204 are disabled. Consequently, the first stage circuit 202 and the second stage circuit 204 fail to be controlled by the clock signal CK and the inverted clock signal $\overline{CK}$.

Meanwhile, the voltage at the node y is pulled up to the power supply voltage Vdd through the second load element R2. That is, the inverted output signal $\overline{Q}$ is the power supply voltage Vdd. Moreover, since the second transistor M2 is turned on, the voltage at the node x is pulled down to the ground voltage Gnd. That is, the output signal Q is the ground voltage Gnd.

Figure 4:
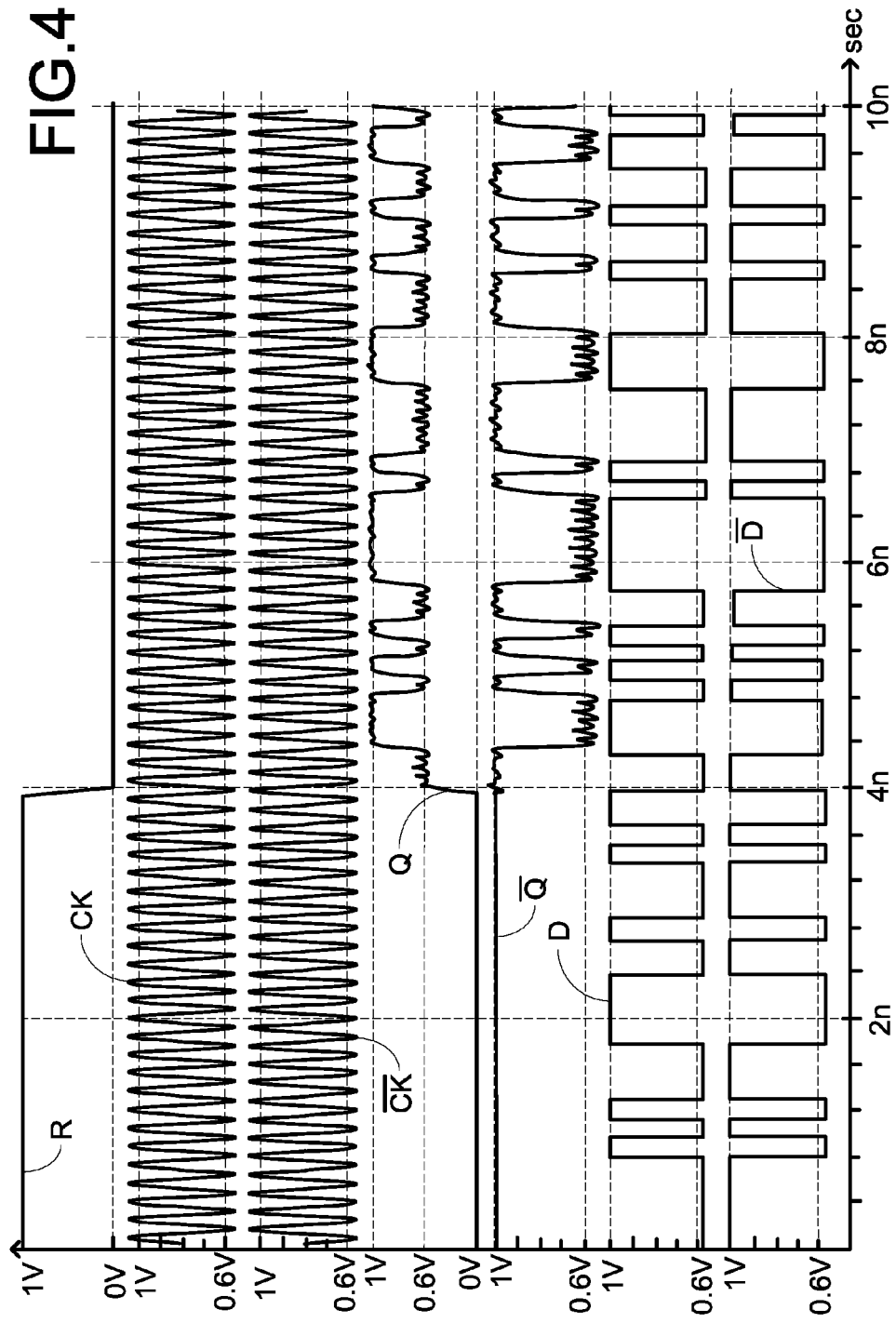
FIG. 4 is a schematic timing waveform diagram illustrating associated signals processed by a rising edge-triggered current-mode D latch with a reset function according to an embodiment of the present invention.

FIG. 4 is a schematic timing waveform diagram illustrating associated signals processed by a rising edge-triggered current-mode D latch with a reset function according to an embodiment of the present invention. Before 4 ns, the current-mode D latch is in the reset state. Since the reset signal R is activated (high voltage level=1V), the output signal Q is the ground voltage Gnd, and the inverted output signal $\overline{Q}$ is the power supply voltage Vdd. After 4 ns, the current-mode D latch is in the normal operation state. Under this circumstance, the output signal Q is identical to the input signal D, and the inverted output signal $\overline{Q}$ is identical to the inverted input signal $\overline{D}$.

Figure 5:
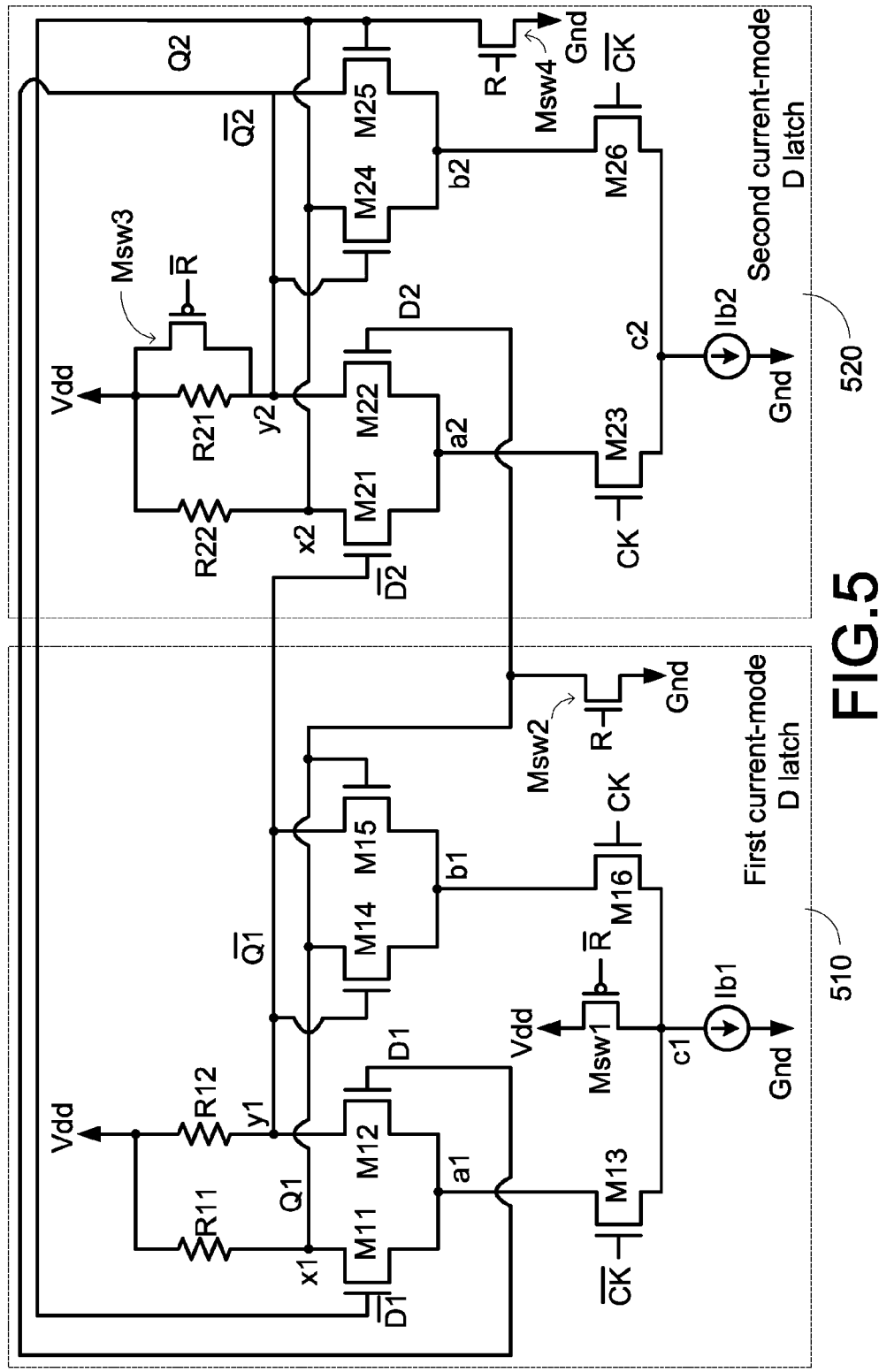
FIG. 5 is a schematic circuit block diagram illustrating a current-mode D latching circuit with a reset function according to an embodiment of the present invention.

Moreover, two current-mode D latches may be connected with each other in series in order to form a frequency divider. FIG. 5 is a schematic circuit block diagram illustrating a current-mode D latching circuit with a reset function according to an embodiment of the present invention. As shown in FIG. 5, the current-mode D latching circuit is a frequency divider comprising two current-mode D latches 510 and 520. A first output signal Q1 is used as a second input signal D2, and a first inverted output signal $\overline{Q1}$ is used as a second inverted input signal $\overline{D2}$. Moreover, a second output signal Q2 is used as a first inverted input signal $\overline{D1}$, and a second inverted output signal $\overline{Q2}$ is used as a first input signal D1.

The configurations of the first current-mode D latch 510 are completely identical to those of the current-mode D latch 300 of FIG. 3, and are not redundantly described herein. In comparison with the current-mode D latch 200 of FIG. 2, the second current-mode D latch 520 further comprises a third switch transistor Msw3 and a fourth switch transistor Msw4. The source terminal of the third switch transistor Msw3 is connected with the power supply voltage Vdd, the drain terminal of the third switch transistor Msw3 is connected with a node y2. The gate terminal of the third switch transistor Msw3 is connected with an inverted reset signal $\overline{R}$. The drain terminal of the fourth switch transistor Msw4 is connected with a node x2. The source terminal of the fourth switch transistor Msw4 is connected with the ground voltage Gnd. The gate terminal of the fourth switch transistor Msw4 receives a reset signal R. In this embodiment, the third switch transistor Msw3 is a P-type transistor, and the fourth switch transistor Msw4 is an N-type transistor.

In the normal operation state, the reset signal R is inactive. That is, the reset signal R is in the low-level state and the inverted reset signal $\overline{R}$ is in the high-level state. Meanwhile, all of the first switch transistor Msw1, the second switch transistor Msw2, the third switch transistor Msw3 and the fourth switch transistor Msw4 are turned off. Under this circumstance, the frequency divider can be normally operated.

In the reset state, the reset signal R is active. That is, the reset signal R is in the high-level state and the inverted reset signal $\overline{R}$ is in the low-level state. Meanwhile, all of the first switch transistor Msw1, the second switch transistor Msw2, the third switch transistor Msw3 and the fourth switch transistor Msw4 are turned on.

Since the first switch transistor Msw1 is turned on, the voltage at the node c1 is pulled up to the power supply voltage Vdd. Under this circumstance, the third transistor M13 and the sixth transistor M16 are turned off. Meanwhile, the first current-mode D latch 510 is disabled. Consequently, the first inverted output signal $\overline{Q1}$ is the the power supply voltage Vdd. Moreover, since the second switch transistor Msw2 is turned on, the first output signal Q1 is the ground voltage Gnd.

Moreover, since the third switch transistor Msw3 is turned on, the voltage at the node y2 is pulled up to the power supply voltage Vdd. Consequently, the second inverted output signal $\overline{Q2}$ is the power supply voltage Vdd. Moreover, since the fourth switch transistor Msw4 is turned on, the second output signal Q2 is the ground voltage Gnd.

FIG. 6 is a schematic timing waveform diagram illustrating associated signals processed by a current-mode D latching circuit with a reset function according to an embodiment of the present invention. Before 4 ns, the current-mode D latching circuit is in the reset state. Since the reset signal R is activated (high voltage level=1V), the second output signal Q2 is the ground voltage Gnd, and the second inverted output signal $\overline{Q2}$ is the power supply voltage Vdd. After 4 ns, the current-mode D latching circuit is in the normal operation state. Under this circumstance, the frequency of the second output signal Q2 is a half of the frequency of the clock signal CK, and the frequency of the second inverted output signal $\overline{Q2}$ is a half of the frequency of the inverted clock signal $\overline{CK}$.

From the above descriptions, the present invention provides a current-mode D latch with a reset function. The current-mode D latch is able to be normally operated at the frequency up to the GHz level and has a reset function. Consequently, the current-mode D latch of the present invention can be applied to the parallel data bus transmission while eliminating the signal skew problem.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures

What is claimed is:

1. A current-mode D latch, comprising:
a first load element connected between a power supply voltage and a node x, wherein the node x generates an output signal;
a second load element connected between the power supply voltage and a node y, wherein the node y generates an inverted output signal;
a first stage circuit comprising a first transistor, a second transistor and a third transistor, wherein the first transistor has a drain terminal connected with the node x, a gate terminal receiving an inverted input signal and a source terminal connected with a node a, wherein the second transistor has a drain terminal connected with the node y, a gate terminal receiving an input signal and a source terminal connected with the node a, wherein the third transistor has a drain terminal connected with the node a, a gate terminal receiving an inverted clock signal and a source terminal connected with a node c;
a second stage circuit comprising a fourth transistor, a fifth transistor and a sixth transistor, wherein the fourth transistor has a drain terminal connected with the node x, a gate terminal connected with the node y and a source terminal connected with a node b, wherein the fifth transistor has a drain terminal connected with the node y, a gate terminal connected with the node x and a source terminal connected with the node b, wherein the sixth transistor has a drain terminal connected with the node b, a gate terminal receiving a clock signal and a source terminal connected with the node c;
a bias current source connected between the node c and a ground voltage;
a first switch transistor connected between the power supply voltage and the node c, and controlled by an inverted reset signal; and
a second switch transistor connected between the node x and the ground voltage, and controlled by a reset signal.

2. The current-mode D latch as claimed in claim 1, wherein the first switch transistor is a P-type transistor, wherein the P-type transistor has a source terminal connected with the power supply voltage, a drain terminal connected with the node c and a gate terminal receiving the inverted reset signal.

3. The current-mode D latch as claimed in claim 1, wherein the second switch transistor is an N-type transistor, wherein the N-type transistor has a source terminal connected with the ground voltage, a drain terminal connected with the node x and a gate terminal receiving the reset signal.

4. A current-mode D latch, comprising:
a first load element connected between a power supply voltage and a node x, wherein the node x generates an output signal;

a second load element connected between the power supply voltage and a node y, wherein the node y generates an inverted output signal;

a bias current source connected between a node c and a ground voltage;

a first switch transistor connected between the power supply voltage and the node c, and controlled by an inverted reset signal;

a second switch transistor connected between the node x and the ground voltage, and controlled by a reset signal;

a first stage circuit connected between the node x, the node y and the node c for receiving an input signal and an inverted input signal, wherein when an inverted clock signal is in a first level state and the reset signal is inactive, the input signal is converted into the output signal and the inverted input signal is converted into the inverted output signal by the first stage circuit; and a second stage circuit connected between the node x, the node y and the node c for receiving the output signal and the inverted output signal, wherein when a clock signal is in the first level state and the reset signal is inactive, the output signal and the inverted output signal are maintained by the second stage circuit.

5. The current-mode D latch as claimed in claim 4, wherein the first switch transistor is a P-type transistor, wherein the P-type transistor has a source terminal connected with the power supply voltage, a drain terminal connected with the node c and a gate terminal receiving the inverted reset signal.

6. The current-mode D latch as claimed in claim 4, wherein the second switch transistor is an N-type transistor, wherein the N-type transistor has a source terminal connected with the ground voltage, a drain terminal connected with the node x and a gate terminal receiving the reset signal.

7. A current-mode D latching circuit, comprising:
a first current-mode D latch comprising a first load element, a second load element, a first bias current source, a first switch transistor, a second switch transistor, a first stage circuit and a second stage circuit, wherein the first load element is connected between a power supply voltage and a node x1, and the node x1 generates a first output signal, wherein the second load element is connected between the power supply voltage and a node y1, and the node y1 generates a first inverted output signal, wherein the first bias current source is connected between a node c1 and a ground voltage, wherein the first switch transistor is connected between the power supply voltage and the node c1 and controlled by an inverted reset signal, wherein the second switch transistor is connected between the node x1 and the ground voltage and controlled by a reset signal, wherein the first stage circuit is connected between the node x1, the node y1 and the node c1 for receiving a first input signal and a first inverted input signal, wherein when an inverted clock signal is in a first level state and the reset signal is inactive, the first input signal is converted into the first output signal and the first inverted input signal is converted into the first inverted output signal by the first stage circuit, wherein the second stage circuit is connected between the node x1, the node y1 and the node c1 for receiving the first output signal and the first inverted output signal, wherein when a clock signal is in the first level state and the reset signal is inactive, the first output signal and the first inverted output signal are maintained by the second stage circuit; and a second current-mode D latch comprising a third load element, a fourth load element, a second bias current source, a third switch transistor, a fourth switch transistor, a third stage circuit and a fourth stage circuit, wherein the third load element is connected between the power supply voltage and a node x2, and the node x2 generates a second output signal, wherein the fourth load element is connected between the power supply voltage and a node y2, and the node y2 generates a second inverted output signal, wherein the second bias current source is connected between a node c2 and the ground voltage, wherein the third switch transistor is connected between the power supply voltage and the node y2 and controlled by the inverted reset signal, wherein the fourth switch transistor is connected between the node x2 and the ground voltage and controlled by a reset signal, wherein the third stage circuit is connected between the node x2, the node y2 and the node c2 for receiving a second input signal and a second inverted input signal, wherein when the clock signal is in the first level state and the reset signal is inactive, the second input signal is converted into the second output signal and the second inverted input signal is converted into the second inverted output signal by the third stage circuit, wherein the fourth stage circuit is connected between the node x2, the node y2 and the node c2 for receiving the second output signal and the second inverted output signal, wherein when the inverted clock signal is in the first level state and the reset signal is inactive, the second output signal and the second inverted output signal are maintained by the fourth stage circuit, wherein the first output signal is used as the second input signal, the first inverted output signal is used as the second inverted input signal, the second output signal is used as the first inverted input signal, and the second inverted output signal is used as the first input signal.

8. The current-mode D latching circuit as claimed in claim 7, wherein the first switch transistor is a P-type transistor, wherein the P-type transistor has a source terminal connected with the power supply voltage, a drain terminal connected with the node c1 and a gate terminal receiving the inverted reset signal.

9. The current-mode D latching circuit as claimed in claim 7, wherein the second switch transistor is an N-type transistor, wherein the N-type transistor has a source terminal connected with the ground voltage, a drain terminal connected with the node x1 and a gate terminal receiving the reset signal.

10. The current-mode D latching circuit as claimed in claim 7, wherein the third switch transistor is a P-type transistor, wherein the P-type transistor has a source terminal connected with the power supply voltage, a drain terminal connected with the node y2 and a gate terminal receiving the inverted reset signal.

11. The current-mode D latching circuit as claimed in claim 7, wherein the fourth switch transistor is an N-type transistor, wherein the N-type transistor has a source terminal connected with the ground voltage, a drain terminal connected with the node x2 and a gate terminal receiving the reset signal.

* * * * *